(12) United States Patent
Wang

(10) Patent No.: US 9,240,791 B2
(45) Date of Patent: Jan. 19, 2016

(54) CLOCK DISTRIBUTION ARCHITECTURE FOR LOGIC TILES OF AN INTEGRATED CIRCUIT AND METHOD OF OPERATION THEREOF

(71) Applicant: Flex Logix Technologies, Inc., Mountain View, CA (US)

(72) Inventor: Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 14/712,864

(22) Filed: May 14, 2015

(65) Prior Publication Data
US 2015/0333756 A1    Nov. 19, 2015

Related U.S. Application Data

(60) Provisional application No. 62/000,361, filed on May 19, 2014, provisional application No. 62/114,558, filed on Feb. 10, 2015.

(51) Int. Cl.
*H03K 19/177* (2006.01)

(52) U.S. Cl.
CPC ...... *H03K 19/1774* (2013.01); *H03K 19/17724* (2013.01); *H03K 19/17748* (2013.01)

(58) Field of Classification Search
CPC ... G06F 1/10; G06F 17/5054; H03K 19/1774; H03K 19/17736; H03K 19/17796; H03K 19/7728; H03K 5/135; H04L 7/0008
See application file for complete search history.

(56) References Cited

U.S. PATENT DOCUMENTS

| 6,204,689 | B1 | 3/2001 | Percey et al. |
| 6,429,715 | B1* | 8/2002 | Bapat et al. .................... 327/295 |
| 6,718,477 | B1* | 4/2004 | Plants et al. ................... 713/500 |
| 7,430,728 | B1 | 9/2008 | Rahut |
| 7,729,415 | B1 | 6/2010 | Possley |
| 2007/0273403 | A1* | 11/2007 | Wang ............................... 326/41 |
| 2008/0061834 | A1* | 3/2008 | Tetsukawa et al. ............. 326/93 |

OTHER PUBLICATIONS

International Search Report and Written Opinion of International Searching Authority, mailed Aug. 18, 2015, 11 pages.

* cited by examiner

*Primary Examiner* — Jany Richardson
(74) *Attorney, Agent, or Firm* — Neil A. Steinberg

(57) ABSTRACT

An integrated circuit includes a plurality of logic tiles, wherein each logic tile includes a plurality of edges and is configurable to connect with adjacent logic tile. Each logic tile includes a plurality of input/output clock paths, wherein each input/output clock path is associated with a different edge of the logic tile. The plurality of input/output clock paths include a plurality of input clock path, each input clock path configurable to receive a tile input clock signal from an adjacent first logic tile, and a plurality of output clock paths, each output clock path configurable to output a tile output clock signal to an adjacent second logic tile. An output clock path includes a u-turn circuit to receive a tile clock signal having a first predetermined skew and provide a tile clock signal having a second predetermined skew.

20 Claims, 15 Drawing Sheets

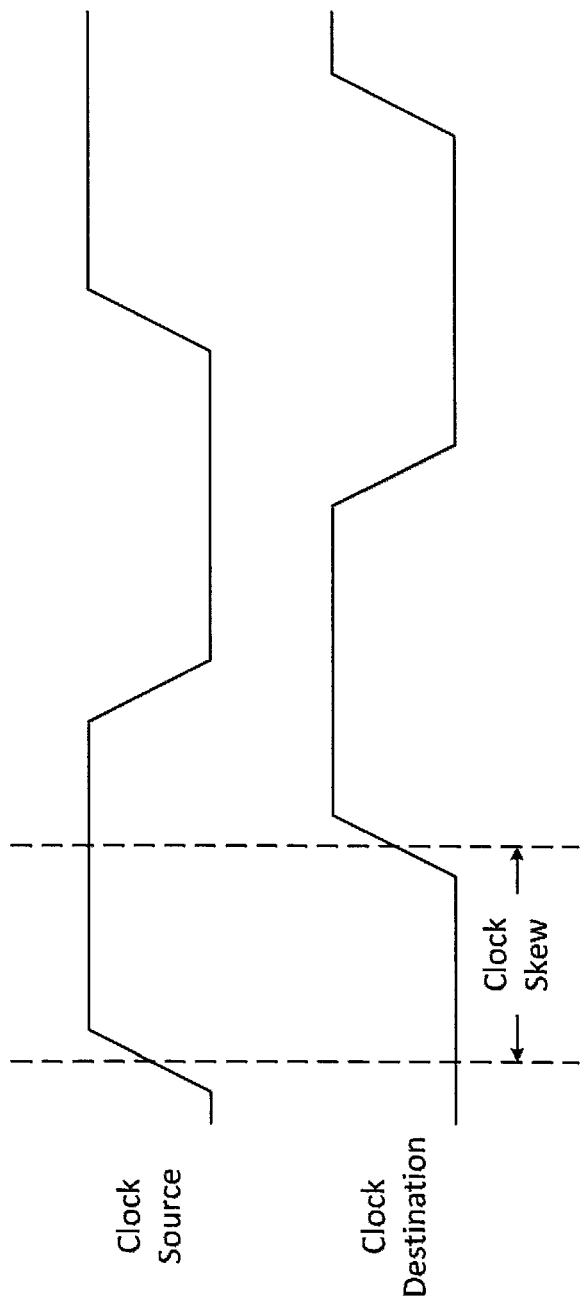

CLOCK DISTRIBUTION ARCHITECTURE FOR LOGIC TILES OF AN INTEGRATED CIRCUIT AND METHOD OF OPERATION THEREOF

RELATED APPLICATION

This non-provisional application claims priority to U.S. Provisional Application No. 62/000,361, entitled "Method and Circuitry of a Clock Distribution Architecture for Logic Tiles of an Integrated Circuit", filed May 19, 2014, and U.S. Provisional Application No. 62/114,558, entitled "Method and Circuitry of a Clock Distribution Architecture for Logic Tiles of an Integrated Circuit", filed Feb. 10, 2015 (hereinafter collectively "the Provisional Applications"). The Provisional Applications are incorporated herein by reference in its entirety.

INTRODUCTION

The present inventions are directed to circuitry of and techniques for clock signal distribution and transmission between logic tiles of an integrated circuit, for example, processors, controllers, state machines, gate arrays, programmable gate arrays (PGAs), field programmable gate arrays (FPGAs), and system-on-chips (SOCs). While the inventions and/or embodiments of the present inventions are often described below in the context of an FPGA, such discussion, inventions and/or embodiments are also applicable to programmable or configurable logic block, logic array block, or logic tile circuitry employed in processors, controllers, state machines, gate arrays, PGAs and SOCs. For the sake of brevity, a separate discussion for each and every integrated circuit is not provided; however the applicability will be clear to one of ordinary skill in the art based on the instant disclosure to, for example, processors, controllers, state machines, gate arrays, PGAs, FPGAs, and SOCs.

Briefly, an FPGA is an integrated circuit which may be configured and/or reconfigured (hereinafter, unless stated otherwise, collectively "configured" or the like (e.g., "configure", "configuring" and "configurable")) by a user, customer and/or a designer before and/or after manufacture. The FPGA includes, among other things, a plurality of tiles having programmable logic components (often called "configurable logic blocks" (CLB), "logic array blocks" (LAB), or "logic tiles"—hereinafter collectively "logic tiles") and a network of configurable interconnects that allow the logic tiles to communicate with each other. Each logic tile has a plurality of inputs and outputs. The programmable interconnect are employed to connect the inputs and outputs of a logic tile to other logic tiles, and also to the FPGA's external inputs and outputs.

Each logic tile typically includes thousands to millions of transistors which may be configured to perform combinational functions (simple and/or complex). The logic tiles may also include memory elements, for example, flip-flops, registers, blocks/arrays of memory or the like, and/or smaller logic tiles of any kind or type. The logic tiles often include circuitry to synchronize clock signals that facilitate orderly implementation of the functions or operations (for example, synchronously) of the logic tile and/or communication with other logic tiles and the FPGA's external inputs and outputs.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 1C illustrates waveforms of clock signals reflecting skew (delay) there between when traveling from a clock source to a clock destination; for example, a clock signal may skew when that signal travels from one clock buffer to another clock buffer, or one clock buffer to a logic element such as a flip-flop, a CLB, or a tile;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In one aspect, the present inventions relate to circuitry for and methods of distributing, generating and/or transmitting clock signals in and/or between logic tiles in integrated circuits, for example, processors, controllers, state machines, gate arrays, PGAs, FPGAs, and SOCs. The circuitry and techniques of the present inventions, in one embodiment, distribute, generate and/or transmit clock signals in and/or between logic tiles of an integrated circuit such that the logic tiles employ a tile clock signal having the desired or programmable skew relative to the tile clock signals of other logic tiles of the programmable/configurable logic circuitry of the integrated circuit. For example, in one embodiment, the clock distribution and transmission circuitry in each logic tile generates local clock signals that are synchronous and have substantially no or zero skew and/or phase difference relative to the tile clock signals employed in or by other logic tiles of the programmable/configurable logic circuitry.

Figure 1A:
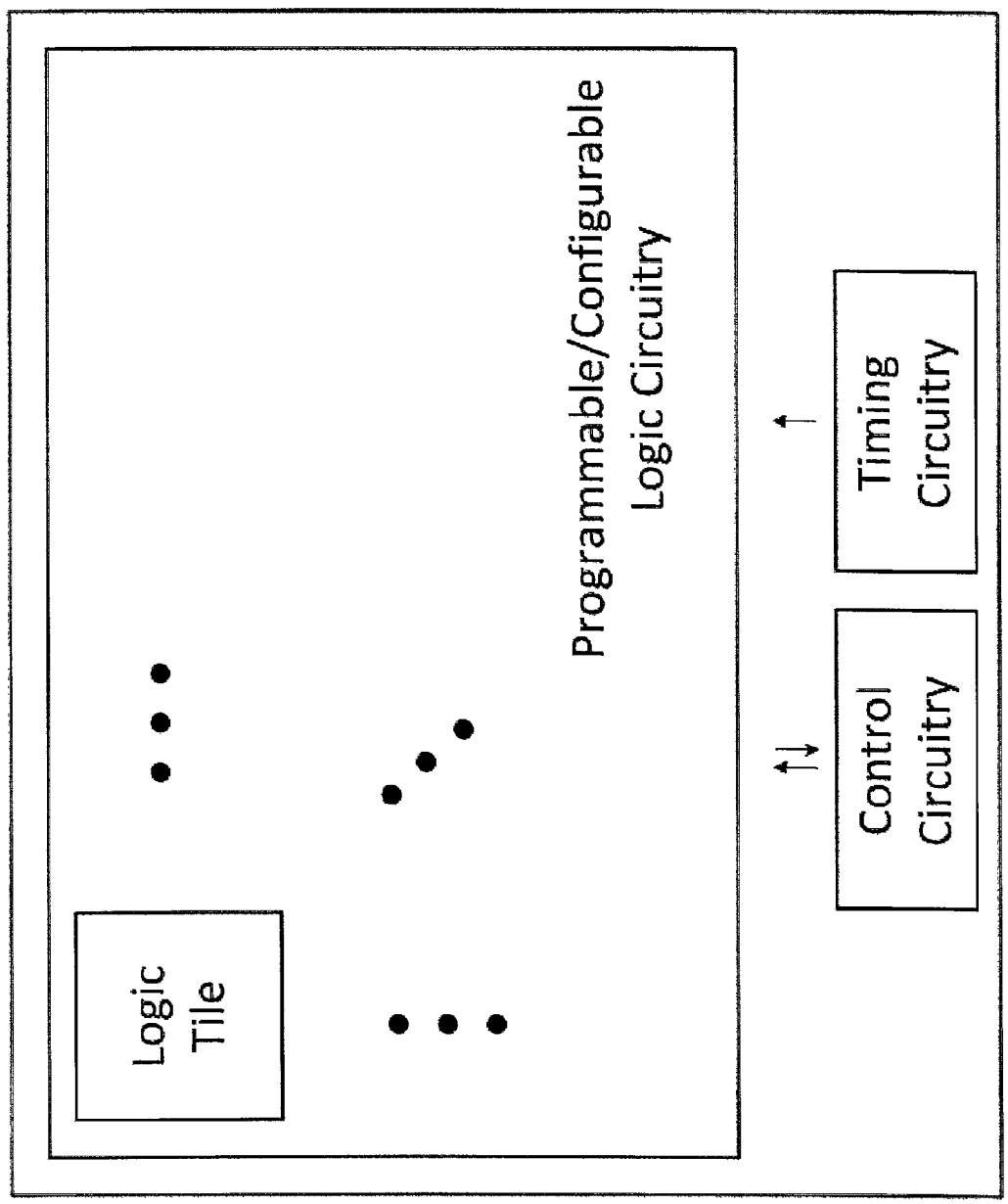
FIG. 1A illustrates a block diagram representation of, for example, an integrated circuit including control circuitry, clock circuitry and programmable/configurable logic circuitry (which may include one or more logic tiles (each of which includes (i) logic transistors and (ii) clock distribution and transmission circuitry); in the illustrative embodiment, the clock circuitry is disposed "on-chip", for example, clock circuitry integrated in/on the die of the integrated circuit generates a clock signal that may be employed by the one or more logic tiles of the programmable/configurable logic circuitry to generate logic tile clock signals having a desired or programmable skew (for example, substantially no or zero skew) and/or phase (for example, 0 degrees or 180 degrees) relative to the tile clock signals of other logic tiles of the programmable/configurable logic circuitry; notably, the clock circuitry may be partially or entirely off-chip (i.e., external to the die of the integrated circuit)
Figure 1B:
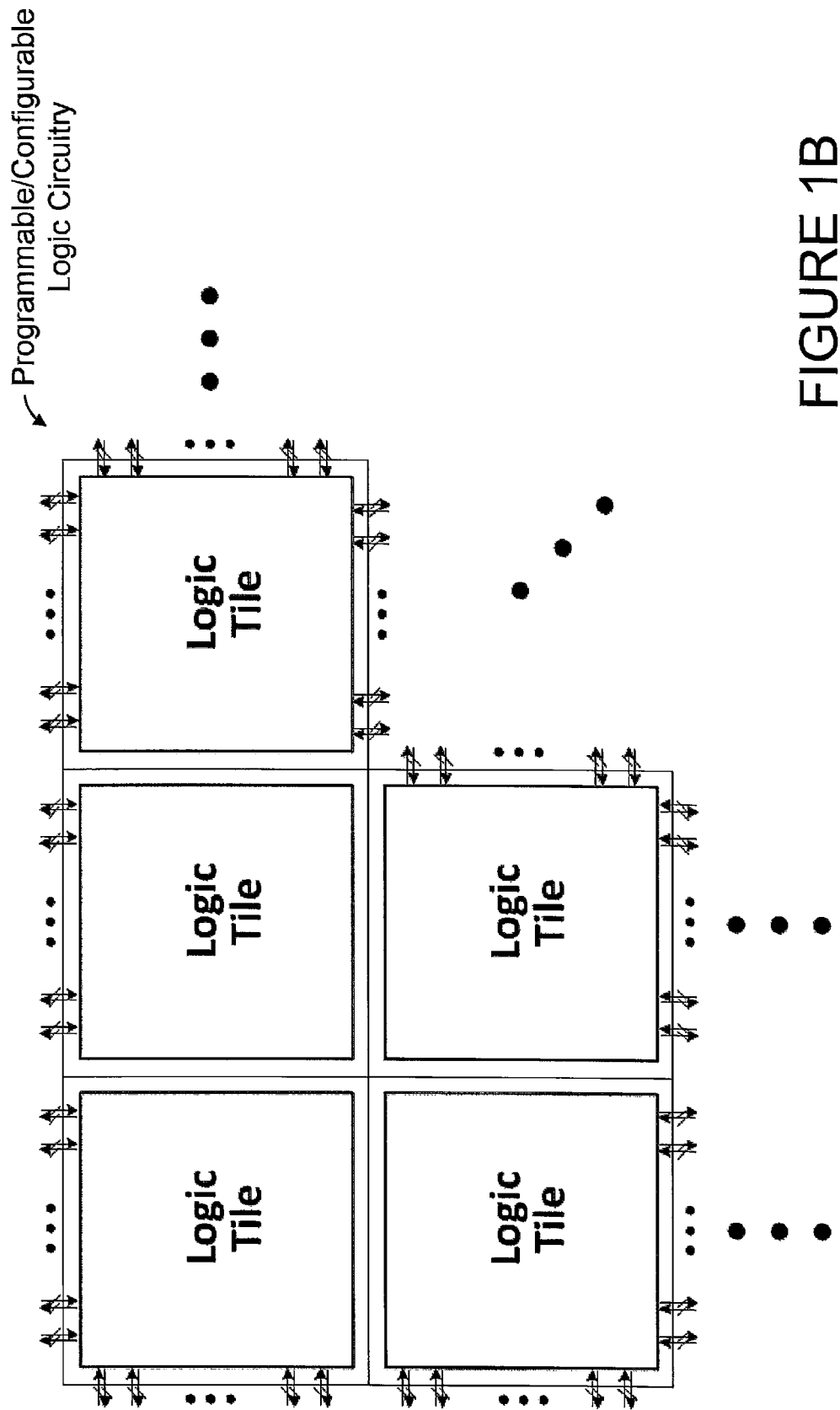
FIG. 1B illustrates a block diagram representation of a plurality of interconnected logic tiles of programmable/configurable logic circuitry, for example, an FPGA, wherein input/output of the logic tiles may facilitate communication between logic tiles and/or circuitry external to the programmable/configurable logic circuitry; notably, the programmable/configurable logic circuitry may be comprised of a plurality of logic tiles interconnected via a one or more configurable interconnects; moreover, one or more (or all) of the logic tiles include clock distribution and transmission circuitry to (i) generate a logic tile clock using the tile's clock tree (see, for example, "Tile Clock" in FIGS. 2A-2C) and (ii) distribute or transmit the logic tile clock or a related clock signal to one or more neighboring logic tiles; the tile clock signal, in one embodiment, is employed to generate a tile clock (see, for example, FIGS. 2A-2C) for use by the logic circuitry (and/or memory) of the associated logic tile.

In one embodiment, the integrated circuit includes control circuitry, clock circuitry and programmable/configurable logic circuitry which may include one or more logic tiles. (See, FIGS. 1A and 1B). The logic tiles may include logic and/or memory transistors (not illustrated) and clock distribution and transmission circuitry to, among other things, generate logic tile clock signals having a desired or programmable skew (for example, substantially no or zero skew) and/or phase (for example, 0 degrees or 180 degrees) relative to the tile clock signals of other logic tiles of the programmable/configurable logic circuitry. The exemplary clock distribution and transmission circuitry, in one embodiment, generates a tile clock (see, for example, FIG. 2A) for the logic circuitry (and/or memory) of the associated logic tile and, in addition, distributes or transmits the logic tile clock or a related clock signal to one or more neighboring or juxtaposed logic tiles of the programmable/configurable logic circuitry.

Briefly, "clock skew" refers to the delays incurred by the clock signals as it travels from a clock source to a clock destination (see, FIG. 1C). This may occur, for example, when traveling from one clock buffer to another clock buffer, or one clock buffer to a logic or memory element such as a flip-flop, a CLB, or a tile. In this application, clock skew refers to the delay in the clock signals when the clock signals travels from one logic tile to another logic tile.

Notably, in the illustrative exemplary embodiment, the clock circuitry is located "on-chip", for example, clock circuitry integrated in/on the die of the integrated circuit. Such clock circuitry (for example, phase-locked-loop (PLL) circuitry and/or Delay-locked-loop (DLL) circuitry may be partially or entirely generated internal to or external from the programmable/configurable logic circuitry (for example, in one or more logic tiles). Alternatively, the clock circuitry may be partially or entirely off-chip and thereby external to the die of the integrated circuit. Regardless, the clock circuitry generates a clock signal that is employed by the one or more logic tiles of the programmable/configurable logic circuitry to generate logic tile clock signals for the associated logic tiles. The logic tile clock may be used by circuitry to facilitate orderly implementation of functions or operations of the logic tile and/or communication with other logic tiles and external inputs and outputs.

Figure 2A:
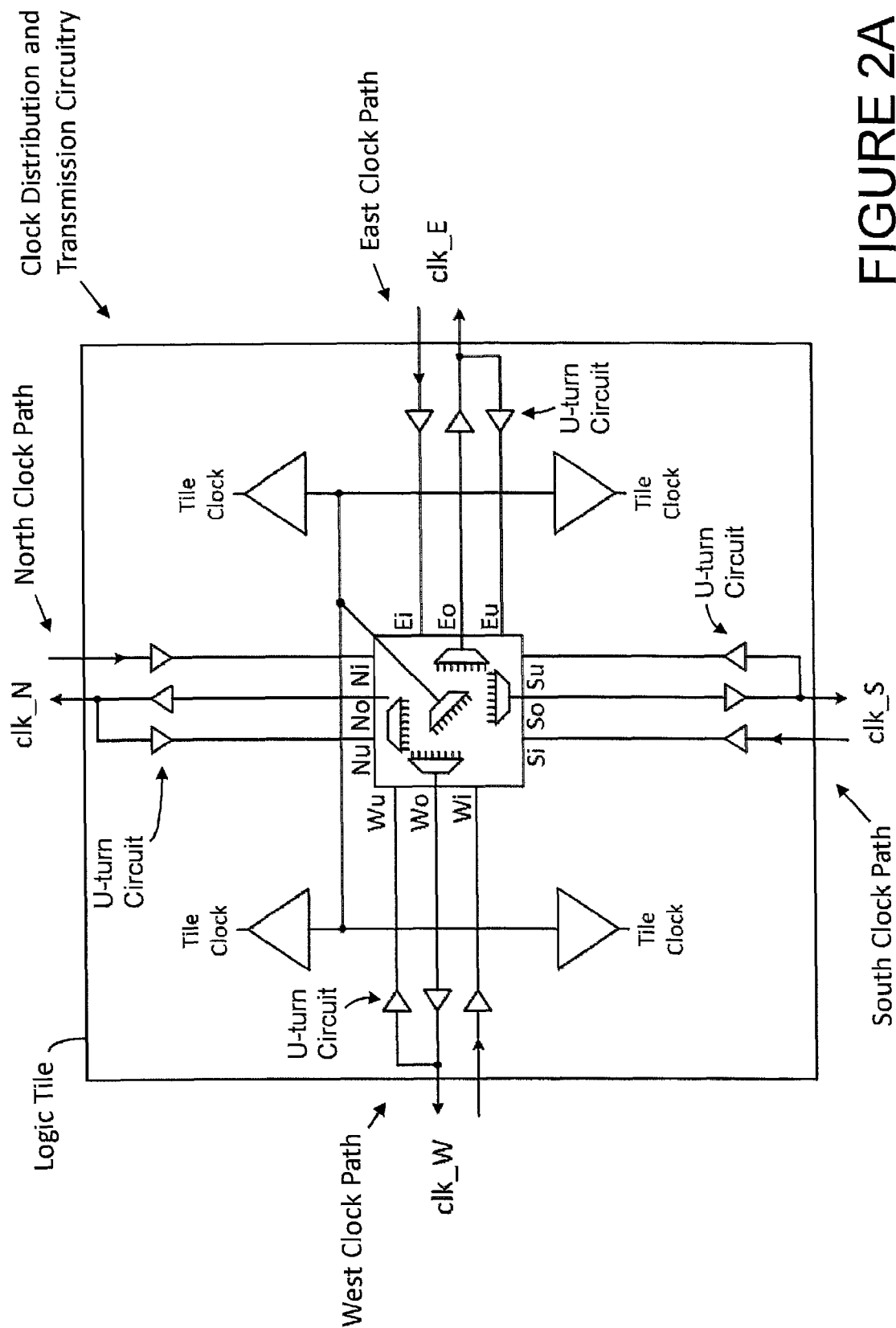
FIGS. 2A-2C illustrate block diagram representations of exemplary embodiments of clock distribution and transmission circuitry of a logic tile wherein in these exemplary embodiments, the clock distribution and transmission circuitry includes a plurality of input and output paths (four paths in this illustrated embodiment—labeled "north clock path", "east clock path", "south clock path" and "west clock path") to generate logic tile clock signals having a desired or programmable skew and, in certain situations, to distribute or transmit one or more logic tile clocks or related clock signals to one or more neighboring logic tiles of the programmable/configurable logic circuitry; each of the input and output paths may include one input/output and u-turn circuit (FIG. 2A), or more than one input/output and u-turn circuit (FIGS. 2B and 2C), or combinations thereof; notably, in this exemplary embodiment, the u-turn circuit includes one or more buffers with their associated wire/conductor routing which, in whole or in part, may be employed in the clock signal distribution path to generate a tile clock signal (having the desired, appropriate or programmable skew relative to the tile clock signals of other logic tiles—see, for example, FIG. 3A) that, in one embodiment, is employed to generate the Tile Clock (i.e., a local clock for that logic tile); as noted above, the tile clock may be employed by, for example, logic circuitry (and/or memory) to implement functions or operations of the associated logic tile and/or synchronize communication with other logic tiles and/or the external inputs and outputs of the programmable/configurable logic circuitry.
Figure 2B:
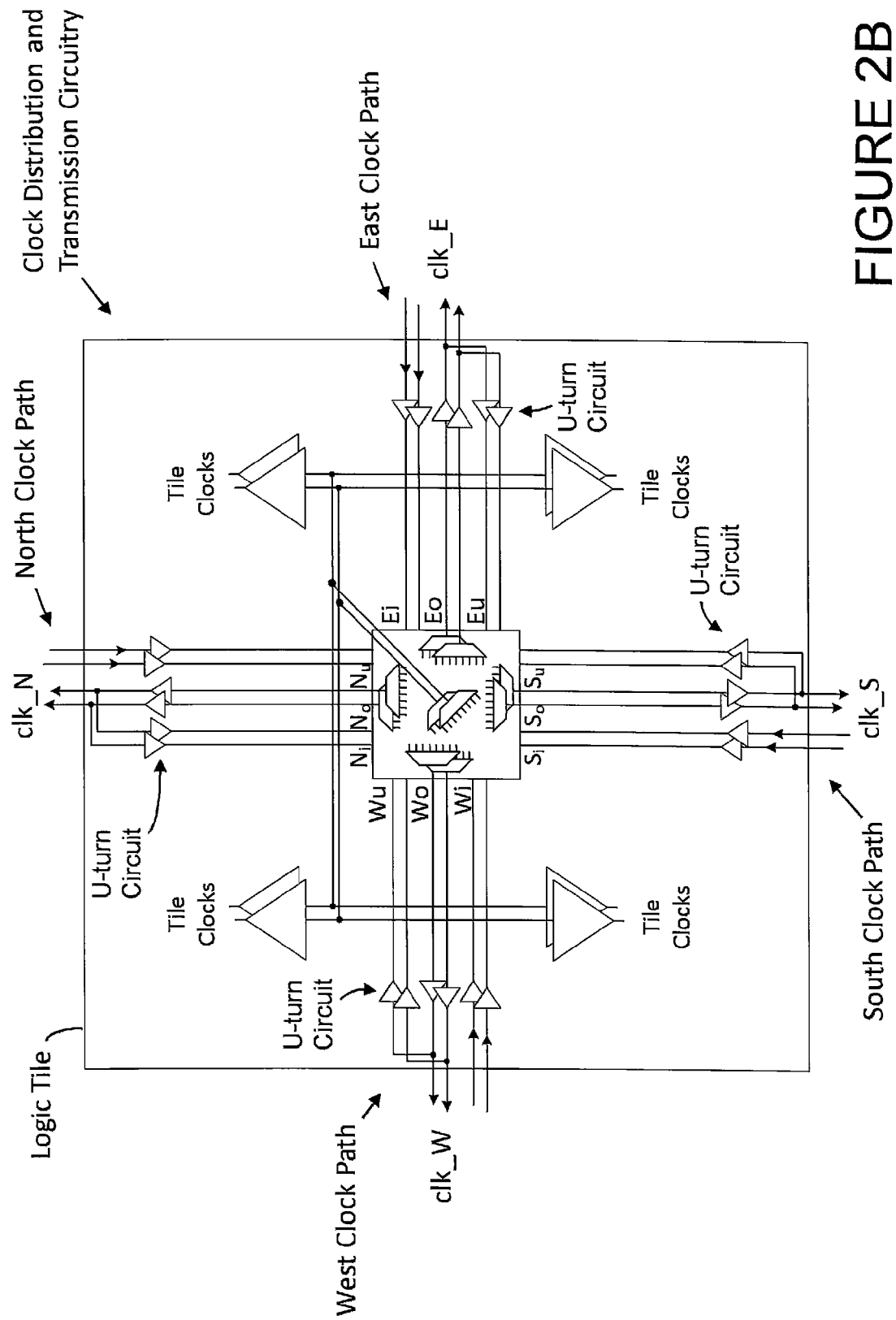
Figure 2C:
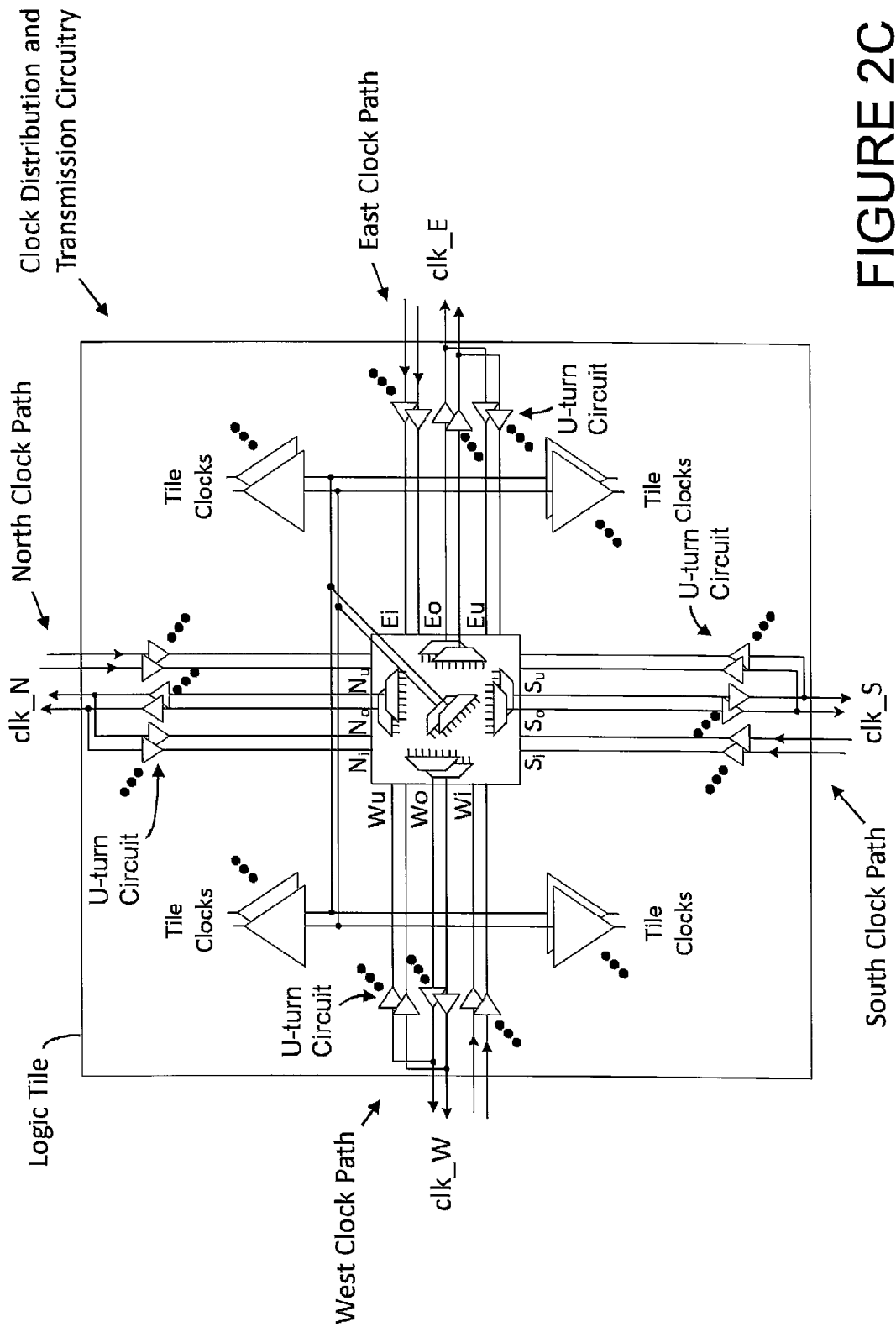

With reference to FIGS. 2A-2C, the clock distribution and transmission circuitry of a logic tile, in one embodiment, includes a plurality of output paths (four paths in this illustrated embodiment—labeled "north clock path", "east clock path", "south clock path" and "west clock path") to generate logic tile clock signals having a desired or programmable skew and, in certain situations, to distribute or transmit one or more logic tile clocks or related clock signals to one or more neighboring logic tiles of the programmable/configurable logic circuitry. Notably, in the exemplary embodiment of FIG. 2A, each of the four clock path has one tile output clock, one tile input clock, and one tile u-turn circuit; whereas in the exemplary embodiment of FIGS. 2B and 2C, each of the four clock path has two or more tile output clocks, two or more tile input clocks, and two or more tile u-turn circuits.

In one embodiment, each clock path includes a plurality of transistors (configured and illustrated, in the exemplary embodiment of FIGS. 2A-2C, as a plurality of buffers). Here, the clock distribution and transmission circuitry includes one or more u-turn circuits which may be selectively incorporated into the clock signal distribution path of the logic tile to generate a tile clock signal having the desired or programmable skew (for example, substantially no or zero skew) and/or phase (for example, 0 degrees or 180 degrees) relative to the tile clock signals of other logic tiles of the programmable/configurable logic circuitry of an integrated circuit. In this exemplary embodiment, a u-turn circuit is disposed at each of the output paths to provide flexibility in design and layout of the architecture for clock generation of one, some or all of the logic tiles of the programmable/configurable logic circuitry. The u-turn circuits in the logic tile may consist of the same or different type circuits or elements—for example, the u-turn circuit of a first output path may consist of one buffer and the u-turn circuit of a second output path may consist of two or more buffers. However, it may be advantageous to construct the u-turn circuits with the same type of circuits (for example, buffers and associated conductors) and/or the same or similar electrical characteristics as the input and output paths. In this way, it may facilitate delay matching of the clock signals from logic tile to logic tile. For example, it may be advantageous to design paths having the same resistive and capacitive loading, the same wire length and shielding, the same type of clock buffers, and the same transistors of such clock buffers to more fully match the delay of the clock signals from logic tile to logic tile. Notably, although in the illustrative embodiments a u-turn circuit is located at all of the output paths of a logic tile, one or more logic tiles may include output paths that do not include u-turn circuits at one, some or all of the output paths.

As mentioned above, the layout of the clock distribution and transmission of the one, some or all of the logic tiles of the programmable/configurable logic circuitry may provide a desired or programmable skew of the clock signals associated with the logic tiles of the programmable/configurable logic circuitry of an integrated circuit. In one embodiment, the clock distribution and transmission circuitry in each logic tile generates local clock signals that are synchronous and have substantially no or zero skew relative to the tile clock signals employed in or by other logic tiles of the programmable/configurable logic circuitry. For example, with reference to FIGS. 3A, 3B, 4A and 4B, in one embodiment, the clock distribution and transmission path for Logic Tiles 1-5 provides substantially no or zero skew between the Tiles 1-5 Clock Signals and/or the Tile Clocks of the Logic Tiles 1-5. The clock signal distribution path, and direction thereof, is indicated by the bold line and the arrows. The clock distribution and transmission circuitry of each Logic Tile 1-5 is programmed to provide a Tile Clock Signal and/or Tile Clock that has substantially no or zero skew relative to the other Tile Clock Signals and/or Tile Clock, respectively.

Figure 3A:
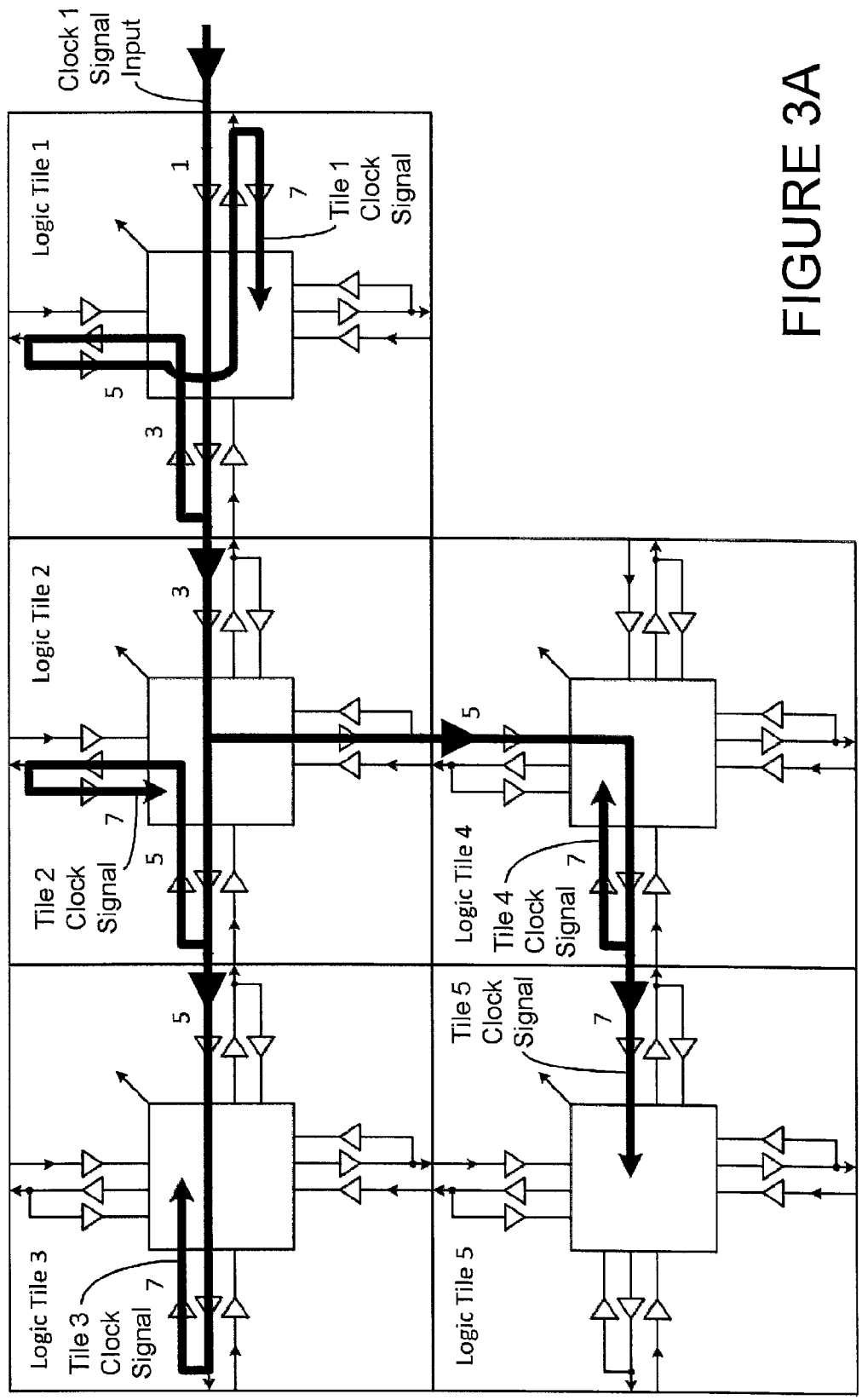
FIGS. 3A and 3B illustrate exemplary block diagram representations of a plurality of interconnected logic tiles of, for example, the type of logic tiles illustrated in FIG. 2A, wherein the tile clock signals are generated in each of the logic tiles via the exemplary clock distribution and transmission circuitry of the associated logic tile; the exemplary clock distribution and distribution paths, and directions thereof, are indicated by the bold line (solid line in FIG. 3A and dashed line in FIG. 3B) and the arrows wherein the clock distribution and transmission circuitry of each logic tile is configured or programmed to provide a clock distribution and distribution path that provides the programmed relationship of the tile clock signals (for example, substantially no or zero skew) that are employed by each of the logic tiles; in the exemplary embodiment of FIG. 3A, Clock 1 signal input is received by Logic Tile 1 which, in addition to distributing and transmitting the clock signal to Logic Tile 2, incorporates a delay that provides a predetermined relationship of the clock signal employed by Logic Tile 1 to the clock signals of Logic Tiles 2-5 (and, in certain embodiments, one, some or all of the other Logic Tiles of the programmable/configurable logic circuitry); in the exemplary embodiment of FIG. 3B, Clock 2 signal input is received by Logic Tile 2 which, in addition to distributing and transmitting the clock signal to Logic Tiles 1, 3 and 4, incorporates a delay that provides a predetermined relationship of the clock signal employed by Logic Tile 2 to the clock signals of Logic Tiles 1 and 3-5 (and, in certain embodiments, one, some or all of the other Logic Tiles of the programmable/configurable logic circuitry); notably, one or more of the clock signal inputs may originate directly or indirectly from clock circuitry disposed "on-chip", for example, clock circuitry integrated in/on the die of the integrated circuit (see, for example, FIG. 1A) or clock circuitry which is partially or entirely external to the die of the integrated circuit (for example, Clock 1 and/or Clock 2 may originate on another logic tiles and/or clock alignment circuitry (for example, a DLL or PLL) which is partially or fully on-chip or off-chip.

In particular, the exemplary embodiment of FIG. 3A, the clock signal input ("Clock 1 Signal") is received by Logic Tile 1. The total delay introduced by each Logic Tile is 7 units. The clock signal distribution path for: (i) Tile 1 Clock Signal, which is associated with Logic Tile 1, incorporates three u-turn circuits (thereby providing a total delay of 7 units), (ii) Tile 2 Clock Signal, which is associated with Logic Tile 2, incorporates two u-turn circuits (thereby providing a total delay of 7 units), (iii) Tile 3 Clock Signal, which is associated with Logic Tile 3, incorporates one u-turn circuit (thereby providing a total delay of 7 units), (iv) Tile 4 Clock Signal, which is associated with Logic Tile 4, incorporates one u-turn circuit (thereby providing a total delay of 7 units) and (v) Tile 5 Clock Signal, which is associated with Logic Tile 5, does not incorporate a u-turn circuit (thereby providing a total delay of 7 units). In this way, the Tile Clock Signals of the Logic Tiles 1-5 of FIG. 3A have substantially no skew there between (in this exemplary embodiment, each include 7 units of delay in the clock distribution path, where each unit represents the equivalent delay of 1 clock branch, which in this exemplary embodiment is the delay of one clock buffer plus its associated wire routing).

Figure 3B:
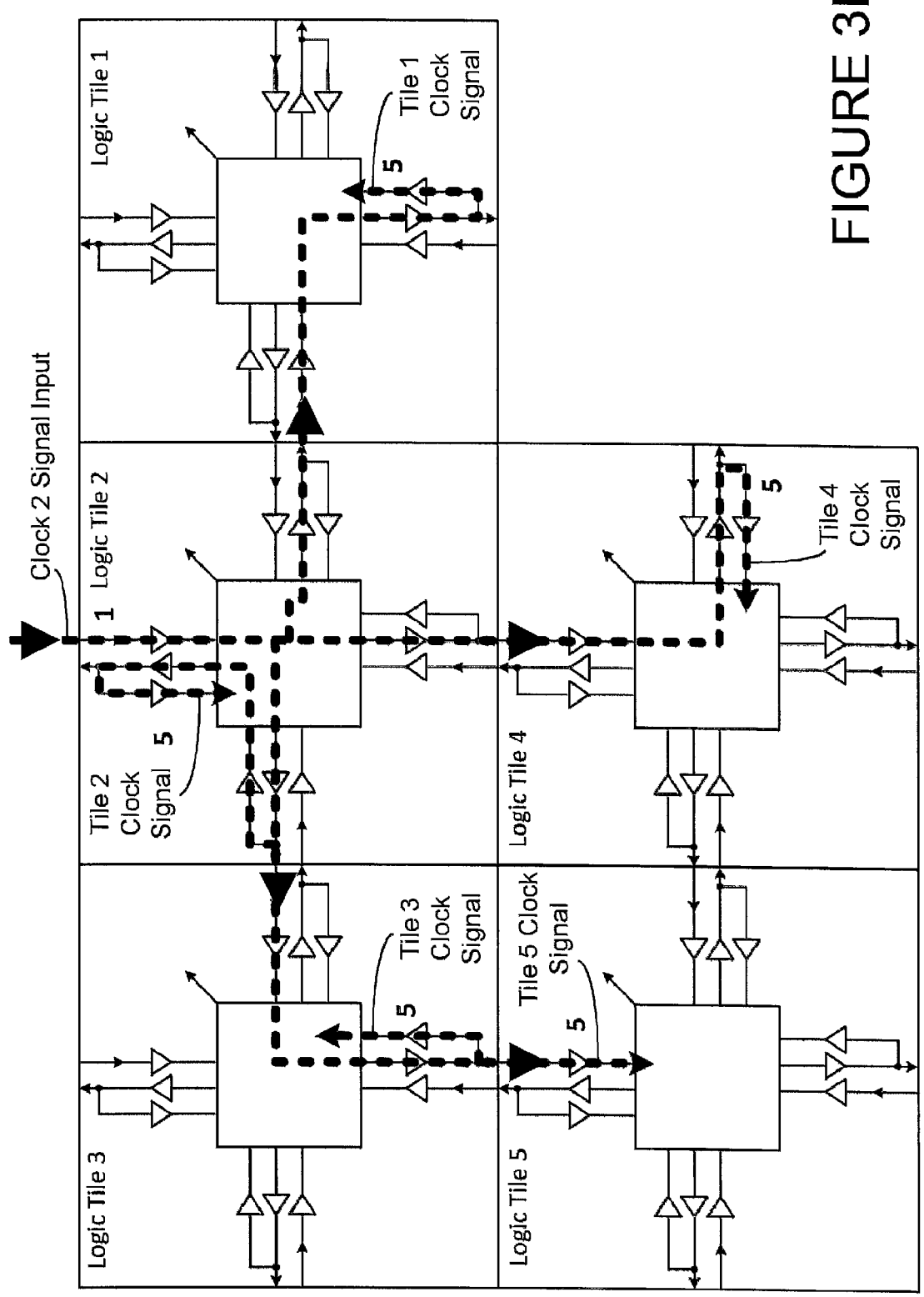

In the exemplary embodiment of FIG. 3B, the clock signal input ("Clock 2 Signal") is received by Logic Tile 2, which incorporates two u-turn circuits in generating Tile 2 Clock Signal. The total delay introduced by Logic Tile 2 is 5 units. Further, the clock generation path associated with Tile 1, which incorporates one u-turn circuit in generating Tile 1 Clock Signal (thereby providing a total delay of 5 units—2 unit in Logic Tile 2 and 3 units on Logic Tile 1). The Tile Clock Signals of Logic Tiles 3-5 also include a total delay of 5 units. In this way, the Tile Clock Signals of the Logic Tiles of FIG. 3B have substantially no skew there between (in this exemplary embodiment, each include 5 units of delay in the clock generation path, where each unit represents the equivalent delay of 1 clock branch, which in this exemplary embodiment is the delay of one clock buffer plus its associated wire/conductor routing).

In another embodiment, the layout of the clock distribution and transmission of the one, some or all of the logic tiles of the programmable/configurable logic circuitry may provide a desired or programmable skew of more than one clock signal input. In one embodiment, the clock distribution and transmission circuitry in one or more logic tiles may generate local clock signals associated with more than one input clock wherein the local clock signals associated with each input clock are synchronous and have substantially no or zero skew relative to the tile clock signals employed in or more other logic tiles of the programmable/configurable logic circuitry. In another embodiment, the clock distribution and transmission circuitry in one or more logic tiles may generate asynchronous local clock signals which have fixed or programmable skew relative to the tile clock signals employed in or more other logic tiles of the programmable/configurable logic circuitry. Notably, with respect to each logic tile, the tile clocks generated based on an input clock may be synchronous or asynchronous relative to the tile clocks generated based on another, different input clock.

Figure 5:
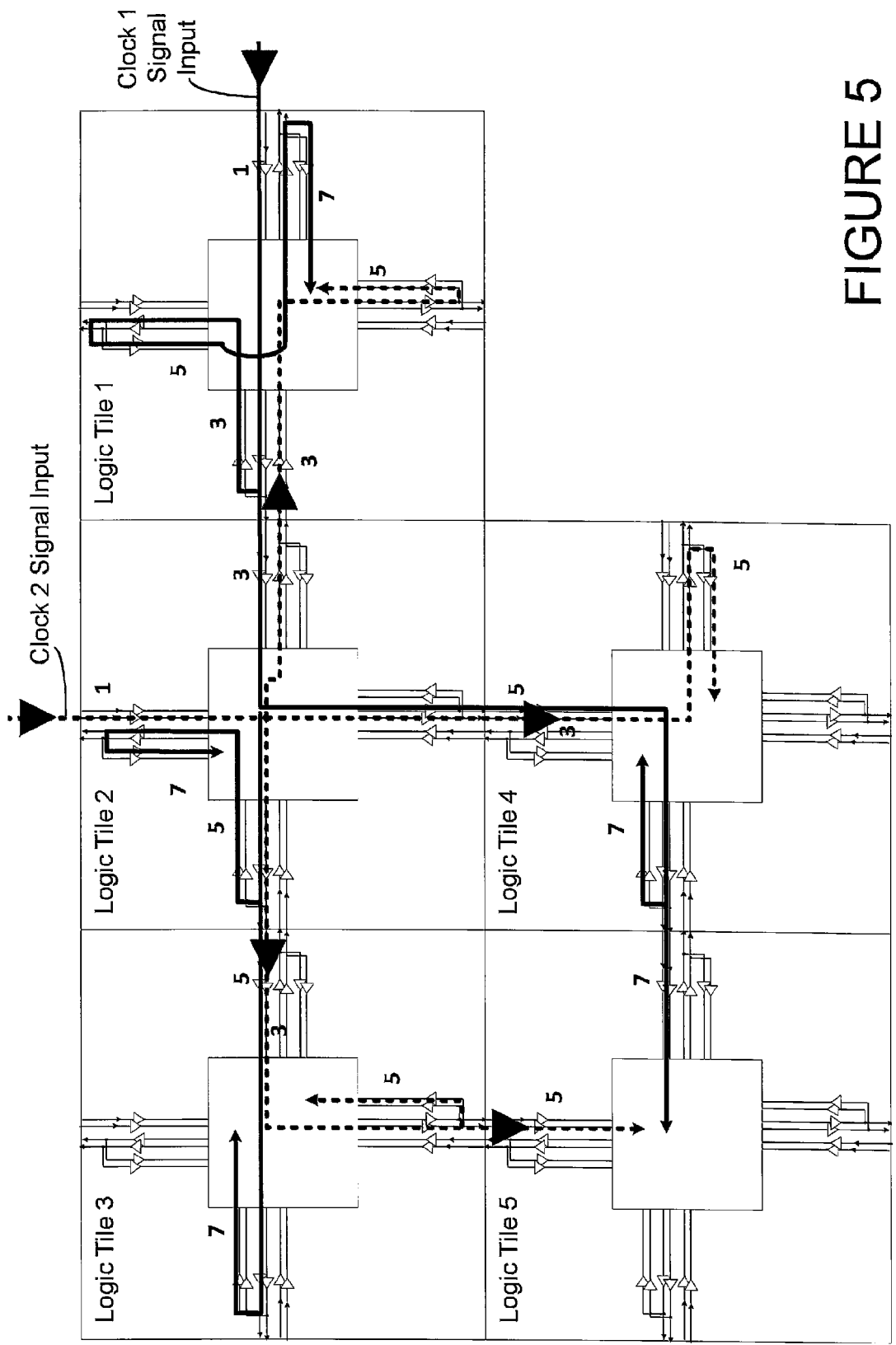
FIG. 5 illustrates an exemplary block diagram representations of a plurality of interconnected logic tiles (of the type illustrated in FIG. 2B) of, for example, an FPGA, wherein each logic tile includes a plurality of inputs/outputs at each input/output path (here, two); in this exemplary embodiment, Logic Tiles 1-5 receive and distribute/output two clock signals (i.e., Clock 1 Signal and Clock 2 Signal) which are distributed to the logic tiles, and via the exemplary clock distribution and transmission circuitry of each logic tile, to generate tile clock signals associated with each of the clock signals for the logic tiles; the exemplary clock distribution and distribution path, and direction thereof, is indicated by the bold solid or dashed lines and the arrows wherein the clock distribution and transmission circuitry of each logic tile is configured or programmed to provide that clock distribution and distribution path that provides the programmed relationship of the tile clock signals (for example, substantially no or zero skew) that are employed by the logic tiles; in the exemplary embodiment Clock 1 is input to Logic Tile 1 and Clock 2 is input is to Logic Tile 2; in both instances, the clock signals are distributed/routed to incorporate a delay that provides a predetermined relationship of the clock signal employed internally by Logic Tiles 1-5 (and potentially one, some or all of the other Logic Tiles of the programmable/configurable logic circuitry)
Figure 6:
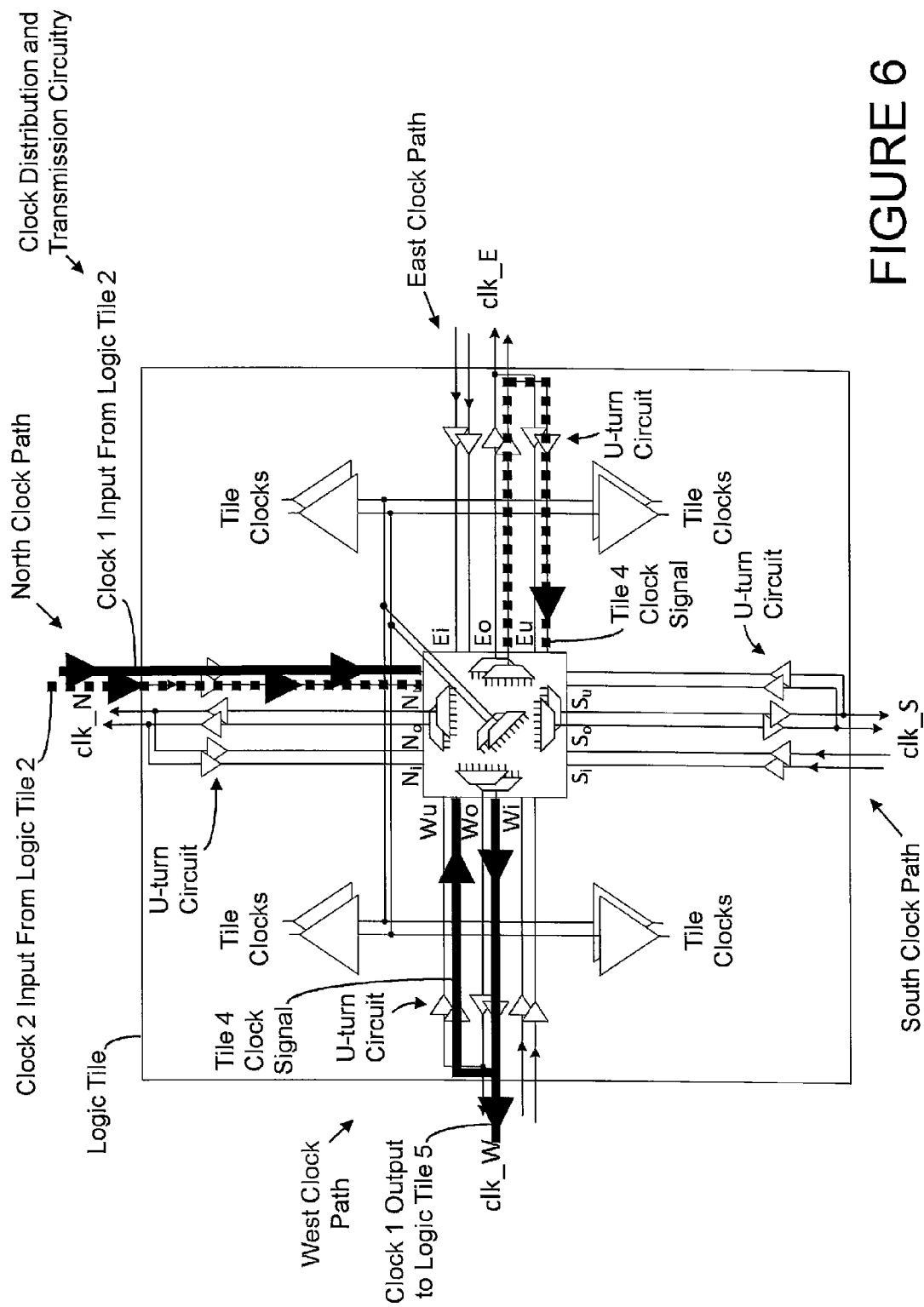
FIG. 6 illustrates block diagram representations of an exemplary clock distribution and transmission circuitry of Logic Tile 4 of the exemplary architecture of FIG. 5, wherein in this exemplary embodiment, the clock distribution and transmission circuitry may employ zero, one or more u-turn circuits associated with the west clock path to generate Tile Clock Signal 4 (having the appropriate or programmable skew relative to the tile clock signals of other logic tiles (here, substantially no or zero skew); the clock distribution and transmission circuitry of Logic Tile 4 includes a plurality of inputs/outputs at each input/output path (in this exemplary embodiment two) which are employed to generate one or more Tile Clocks associated with either Clock 1 or Clock 2; such tile clocks may be synchronous or asynchronous, for example, based on whether Clock 1 and Clock 2 are synchronous or asynchronous; each Tile Clock may be employed by, for example, the logic circuitry (and memory) to implement functions or operations of the logic tile and/or communication with other logic tiles and/or the external inputs and outputs of the programmable/configurable logic circuitry.

In particular, with reference to FIGS. 5 and 6, in one embodiment, the clock distribution and transmission path for Logic Tiles 1-5 (which are the type of FIG. 2B or 2C) with respect to Clock 1 provides substantially no or zero skew between the Tile Clocks (associated with Clock 1) of the Logic Tiles 1-5. Similarly, clock distribution and transmission path for Logic Tiles 1-5 with respect to Clock 2 provides substantially no or zero skew between the Tile Clocks (associated with Clock 2) of the Logic Tiles 1-5. The clock signal distribution path, and direction thereof, for Clock 1 is indicated by the bold line and the arrows. The clock signal distribution path, and direction thereof, for Clock 2 is indicated by the dashed line and the arrows. In this embodiment, the clock distribution and transmission circuitry of each Logic Tile 1-5 is programmed to provide a Tile Clock Signal and/or Tile Signal in connection with Clock 1 that has substantially no or zero skew relative to the other Tile Clock Signals and/or Tile Signal, respectively, associated with Clock 1. Similarly, the clock distribution and transmission circuitry of each Logic Tile 1-5 is programmed to provide a Tile Clock Signal and/or Tile Signal in connection with Clock 2 that has substantially no or zero skew relative to the other Tile Clock Signals and/or Tile Signal, respectively, associated with Clock2.

Thus, in those embodiments where one or more logic tiles receive, transmit, distribute and generate a plurality of clock signals—based on different input clocks, the clock distribution and transmission circuitry of each Logic Tile may employ a plurality of input and output clock buffers of each path to generate and distribute such clocks. In this exemplary embodiment, each tiles generates, distributes and supports two tile output clocks, two tile input clocks, and two tile u-turn circuits for each clock path, and, as such, each logic tile propagates two independent clock signals to those pertinent tiles and generate two local clocks (Tile Clock Signals corresponding to Clock 1 Signal Input and Clock 2 Signal Input—each employed to generate independent "Tile Clocks" for the associated logic tiles).

Figure 4A:
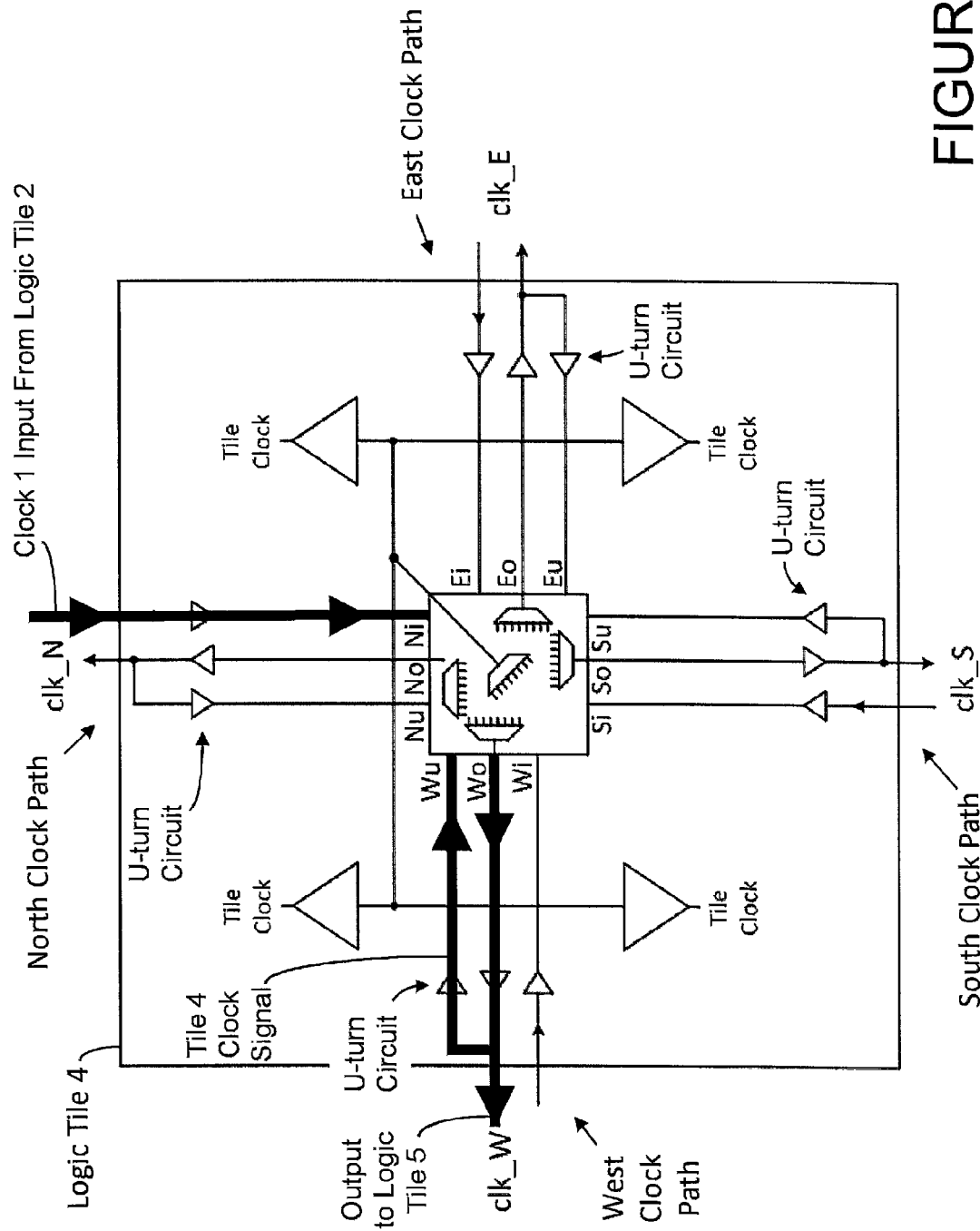
FIGS. 4A and 4B illustrate block diagram representations of exemplary embodiments of clock distribution and transmission circuitry of Logic Tile 4 of the exemplary architecture of, for example, FIGS. 3A and 3B, respectively, wherein in these exemplary embodiments, the clock distribution and transmission circuitry may employ zero, one or more u-turn circuits associated with the west clock path to generate Tile Clock Signal 4 (having the appropriate or programmable skew relative to the tile clock signals of other logic tiles (here, substantially no or zero skew)—see, for example, FIGS. 3A and 3B); the Tile Clock Signal 4, in this embodiment, generates one or more Tile Clocks employed by, for example, the logic circuitry (and memory) to implement functions or operations of the logic tile and/or synchronize communication with other logic tiles and/or the external inputs and outputs of the programmable/configurable logic circuitry.
Figure 4B:
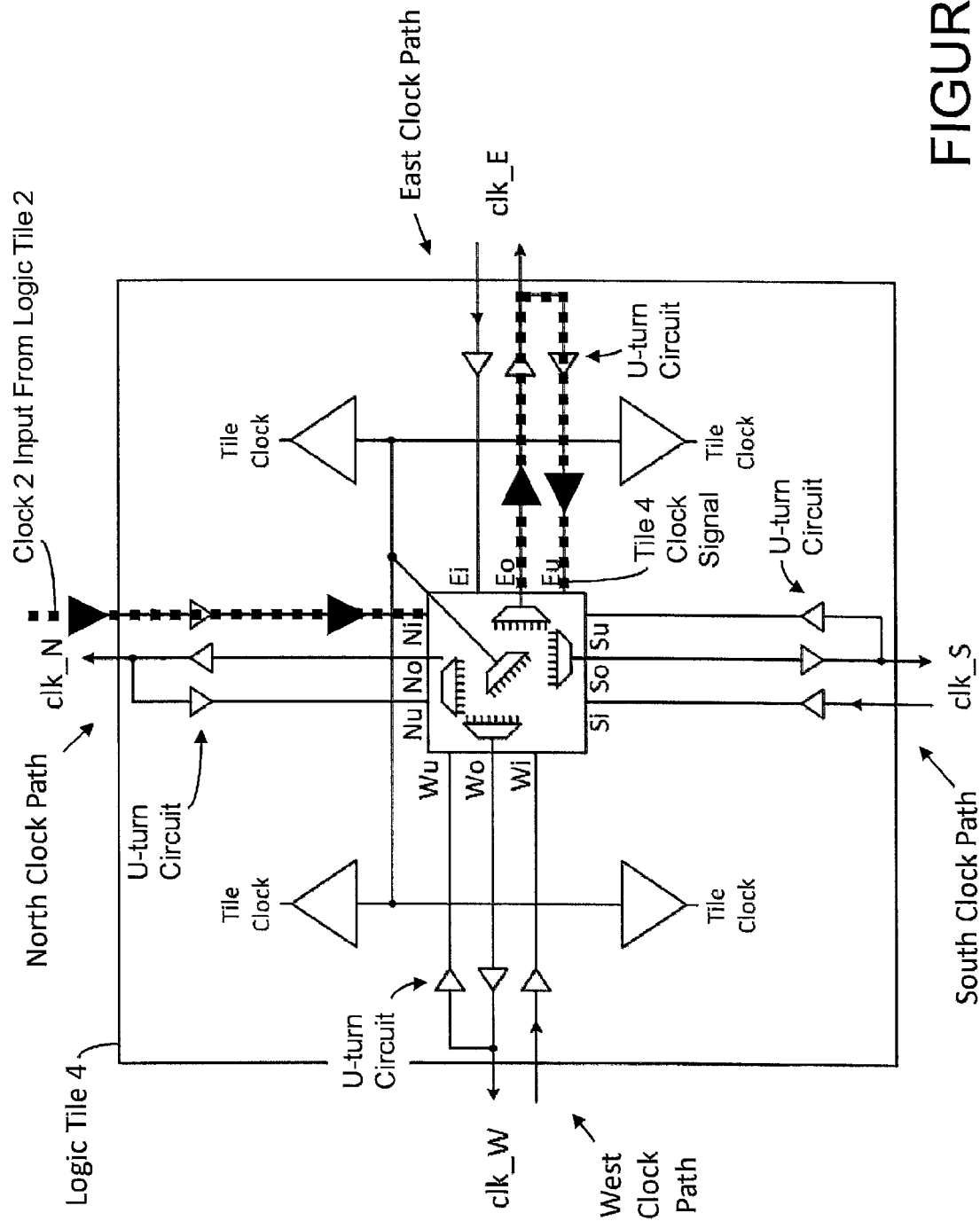

Notably, with reference to FIGS. 4A, 4B and 6, the Tile Clock Signals associated with Clock 1 and Clock 2 may be employed to generate multiple synchronous or asynchronous Tile Clocks (based on Clock 1 and/or Clock 2) which are employed by, for example, the logic circuitry (and memory) to implement synchronous or asynchronous functions or operations of or in the logic tile and/or synchronous or asynchronous communication with other logic tiles and/or the external inputs and outputs of the programmable/configurable logic circuitry. Such synchronous or asynchronous clocks may be relative to Clock 1, or Clock 1 and Clock 2

Notably, the techniques of the present inventions may be implemented using one or more processors (suitably programmed) to perform, execute and/or assess an architecture for clock distribution of one, some or all of the logic tiles of the programmable/configurable logic circuitry. The clock distribution architecture may selectively incorporate one or more (or none if appropriate) u-turn circuits into the clock signal path of one or more of the logic tiles to generate a tile clock signal having the desired or programmable skew relative to the tile clock signals of other logic tiles of the programmable/configurable logic circuitry of an integrated circuit.

Although the Tile Clock Signals of the logic tiles of FIGS. 3A, 3B and 5 have been configured or designed to provide substantially no skew there between (each include seven buffers in the clock distribution path), the Tile Clock Signals may be configured or designed (and thereafter constructed) to include a predetermined or programmed clock skew relative to one or more Tile Clock Signals of other logic tiles of the programmable/configurable logic circuitry of an integrated circuit. The architecture for clock distribution of one, some or all of the logic tiles of the programmable/configurable logic circuitry may be designed to provide a desired or programmable non-zero skew relative to the tile clock signals of other logic tiles of the programmable/configurable logic circuitry of an integrated circuit. Notably, the programmable skew may be fixed or programmable/variable (whether one time or multiple times), for example, during use (in situ) and/or based on one or more operating conditions. Moreover, programmable skew may be fixed and/or programmable after manufacture, deployment and/or during operation (for example, in situ by a user and/or operator of the electronic device associated with the control circuitry).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, although the u-turn circuits have been described and illustrated as being located at/in associated output paths, the u-turn circuits need not be located at/in and associated with an output path—but simply associated with the clock distribution and transmission circuitry of the logic tile.

Further, as intimated above, although each clock path of the logic tiles of FIGS. 2A-2C includes at least one u-turn circuit, one or more logic tiles may include clock paths that do not include u-turn circuits. Moreover, as indicated above, the u-turn circuits disposed at each of the output path may be the same or different type circuits—for example, at first output path, the u-turn circuit may consist of one buffer and, at a second output path, the u-turn circuit may consist of two or more buffers.

Indeed, the u-turn circuits in the logic tiles may be incorporated into the clock paths to program or balance clock skew and/or phase (for example, maintaining substantially no or zero skew) between clock signals of the logic tiles. Circuits or circuit configurations other than u-turn circuits may be employed to program or balance clock skew and/or phase by incorporating, matching or providing a programmable delay of the clock signals of the logic tiles.

Figure 7:
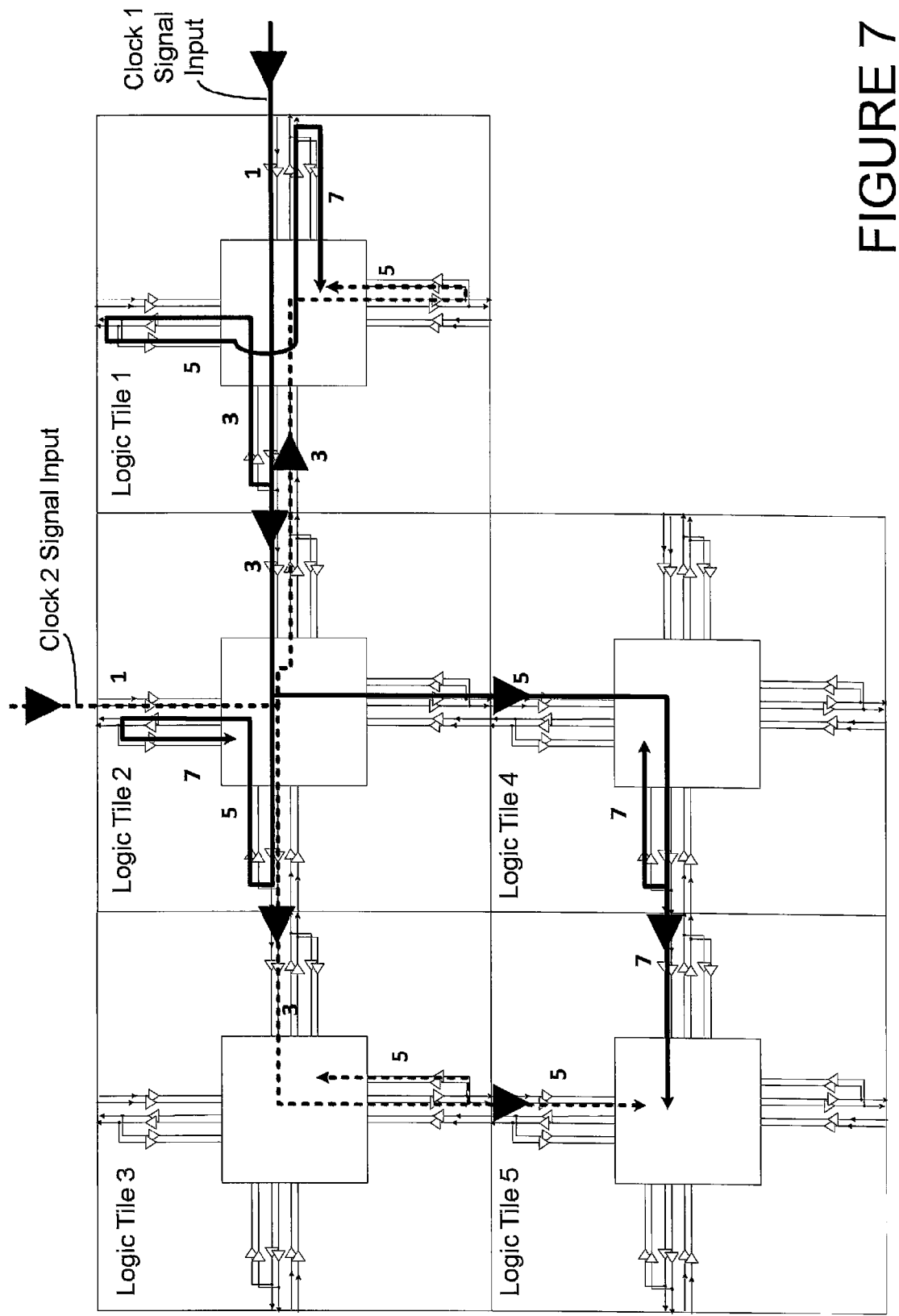
FIG. 7 illustrates a block diagram representation of a plurality of interconnected logic tiles (of the type illustrated in FIG. 2B) of, for example, an FPGA, wherein each logic tile includes a plurality of inputs/outputs at each input/output path (in this exemplary embodiment two); in this exemplary embodiment, Logic Tiles 1-3 each receive two clock signals (i.e., Clock 1 Signal and Clock 2 Signal) which are distributed to some but not all of the logic tiles; via the exemplary clock distribution and transmission circuitry of each logic tile, logic tiles generate tile clock signals associated with one or both of the clock signals; the exemplary clock distribution and distribution path, and direction thereof, is indicated by the bold solid or dashed lines and the arrows wherein the clock distribution and transmission circuitry of each logic tile is configured or programmed to provide that clock distribution and distribution path that provides the programmed relationship of the tile clock signals (for example, substantially no or zero skew) that are employed by the logic tiles; in the exemplary embodiment Clock 1 is input to Logic Tile 1 and Clock 2 is input is to Logic Tile 2; in both instances, the clock signals are distributed/routed to incorporate or create a delay that provides or generates a predetermined relationship of the clock signal employed internally by one some or all of Logic Tiles 1-5.

Moreover, although the clock distribution and transmission path for logic tiles for one or more of the programmable/ configurable logic circuitry may generate independent tile clocks (using independent, for example, asynchronous input clocks), not all of the logic tiles of the programmable/configurable logic circuitry may generate and/or distribute such independent clocks. For example, with reference to FIG. 7, Logic Tile 3 does not generate one or more tile clocks corresponding to Clock 1 and Logic Tile 4 does not generate one or more tile clocks corresponding to Clock 2. Similarly, Logic Tile 2 does not generate one or more tiles clocks corresponding to Clock 2—however, the clock distribution path for Clock 2 includes Logic Tile 2.

Further, it may be advantageous to disable those buffers, transistors (and other active or passive elements) in non-selected portions of the clock path or portions of the clock distribution and transmission circuitry of logic tiles that are not incorporated into the clock distribution, generation and/or transmission path (hereinafter collectively, "non-selected circuitry"). For example, with reference to FIG. 6, the entire South Clock Path and/or the u-turn circuit and output buffer of the North Clock Path may be disabled (for example, permanently or if and until the clock path is reconfigured or reprogrammed—for example, in situ or during test). In one embodiment, the circuitry may be disabled by not propagating or providing power to such non-selected portions (for example, during design and/or manufacture). In another embodiment, the circuitry may be disabled via one or more control signals from, for example, the control circuitry.

Figure 8:
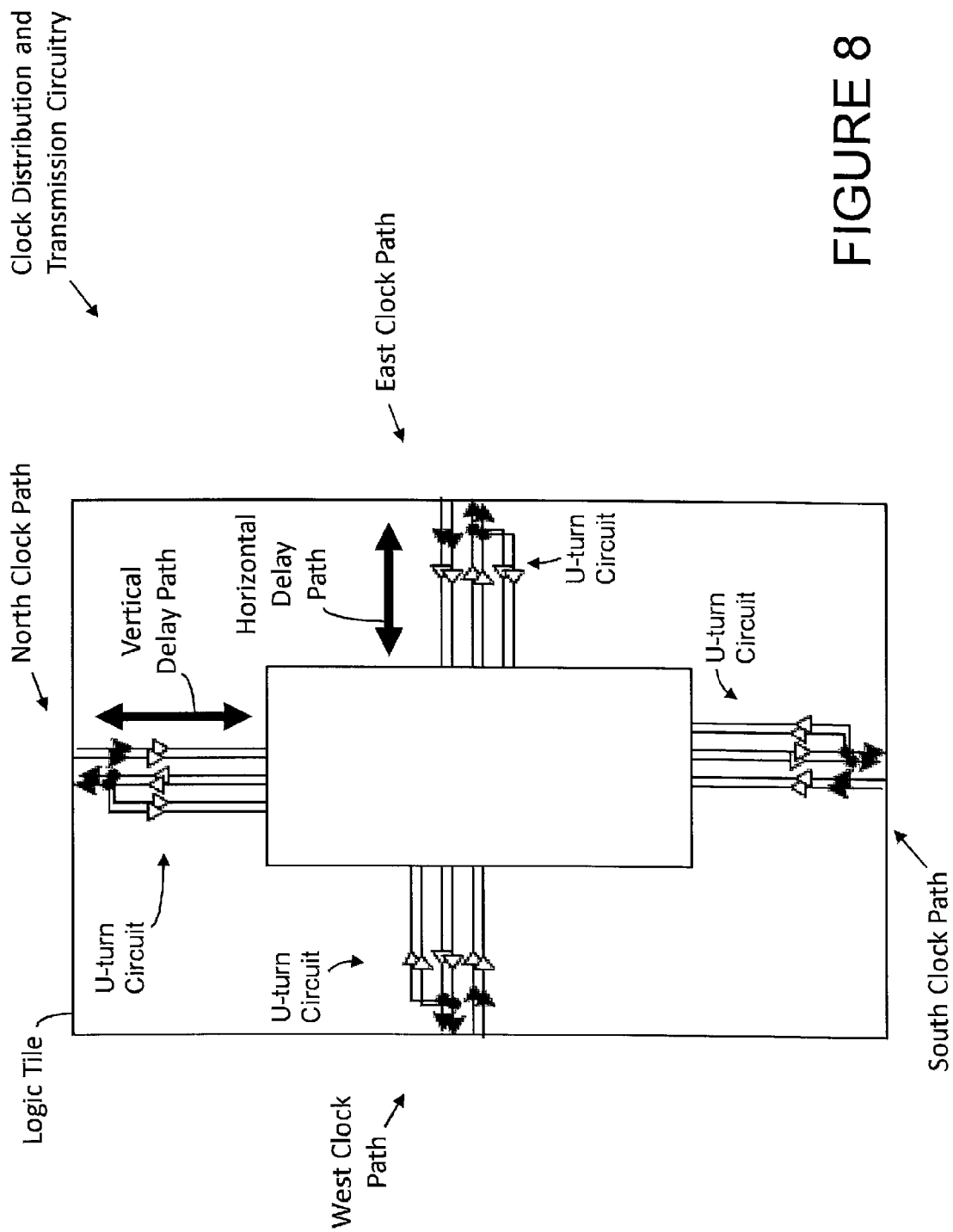
FIG. 8 illustrates a block diagram representation of an exemplary clock distribution and transmission circuitry of a rectangular-shaped logic tile wherein in this exemplary embodiment, the clock distribution and transmission circuitry includes a plurality of input and output paths (four paths in this illustrated embodiment—labeled "north clock path", "east clock path", "south clock path" and "west clock path") to generate logic tile clock signals having a desired or programmable skew and, in certain situations, to distribute or transmit one or more logic tile clocks or related clock signals to one or more neighboring logic tiles of the programmable/configurable logic circuitry; each of the input and output paths may include one input/output and u-turn circuit to introduce additional vertical and horizontal propagation delay components of the clock signal path (wherein the length of the vertical paths are different from horizontal paths); notably, in this exemplary embodiment, the u-turn circuit includes one or more buffers with their associated wire/conductor routing which, in whole or in part, may be employed in the clock signal distribution path to generate a tile clock signal (having the appropriate or programmable skew relative to the tile clock signals of other logic tiles see, for example, FIG. 9) that, in one embodiment, such circuitry is employed to generate the Tile Clock (i.e., a local clock for that logic tile); as noted above, the tile clock may be employed by, for example, the logic circuitry (and/or memory) to implement functions or operations of the associated logic tile and/or synchronize communication with other logic tiles and/or the external inputs and outputs of the programmable/configurable logic circuitry.

The present inventions may be employed in connection with any "shape" tile including, for example, square, rectangle, trapezoid, pentagon and/or hexagon. Where the propagation delay of clock input and output paths in one direction are different from another direction (for example, the delay introduced in the vertical direction are different from the delay introduced in the horizontal direction), the control circuitry may program the clock distribution path to provide a relationship of the horizontal and vertical propagation delay components between the tiles. For example, with reference to FIG. 8, an exemplary clock distribution and transmission circuitry of a rectangular-shaped logic tile includes input and output clock signal path lengths in a vertical direction that are different than a horizontal direction and, as such, the input and output paths of the logic tile may include one input/output and u-turn circuit to introduce additional vertical and horizontal propagation delay components of the clock signal path (wherein the length of the vertical paths are different from horizontal paths). Under these circumstances, the relationship of the vertical clock signal line propagation delay and horizontal clock signal line propagation delay may be determined, calculated and/or compensated separately by the control circuitry (and/or clock distribution and transmission circuitry) when determining a predetermined or desired skew (for example, no or zero skew) between logic tiles.

Figure 9:
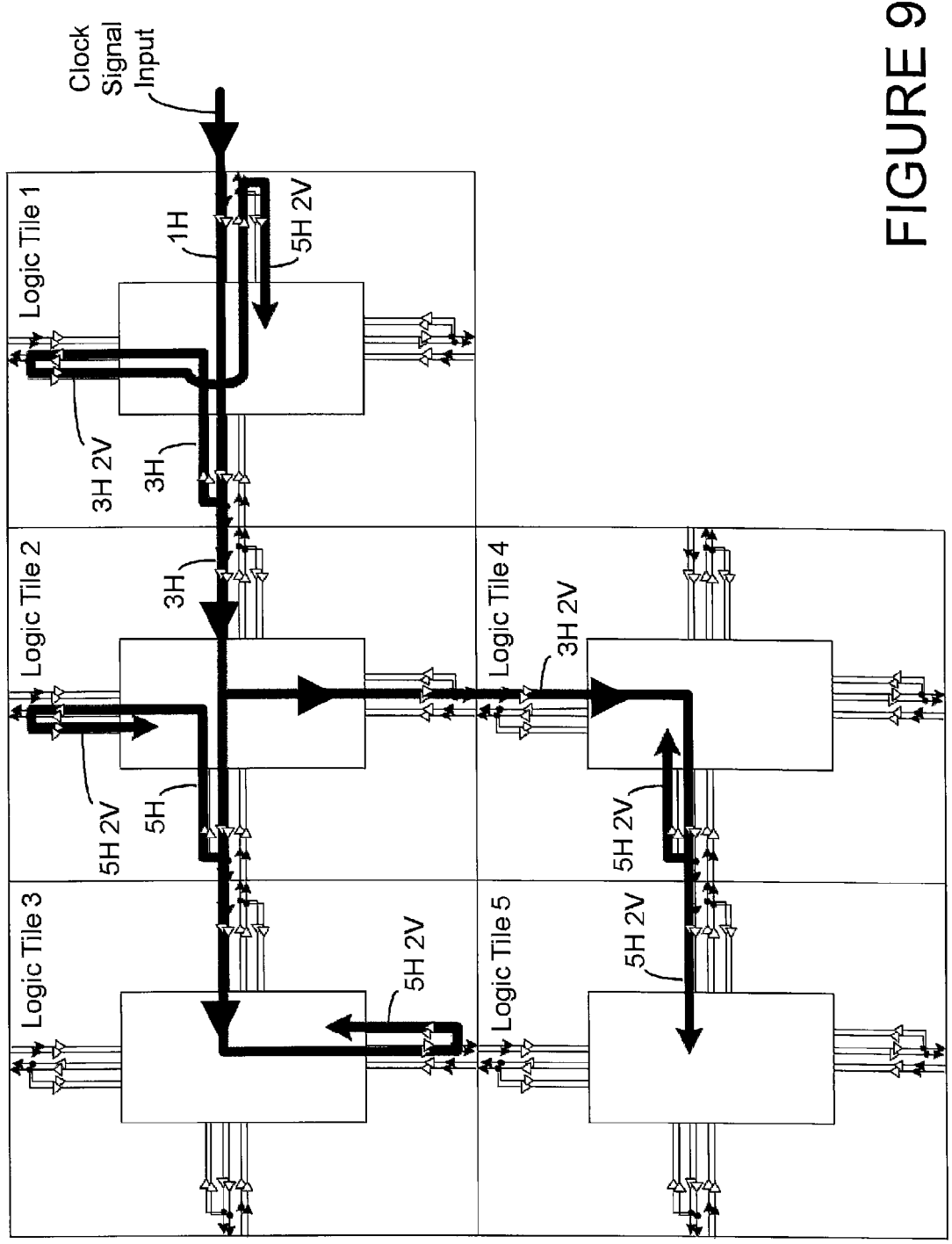
FIG. 9 illustrates an exemplary block diagram representation of a plurality of interconnected logic tiles of, for example, the type of logic tiles illustrated in FIG. 8, wherein the tile clock signals are generated in each of the logic tiles via the exemplary clock distribution and transmission circuitry of the associated logic tile; the exemplary clock distribution and distribution path, and direction thereof, is indicated by the bold line and the arrows wherein the clock distribution and transmission circuitry of each logic tile is configured or programmed to provide a clock distribution and distribution path (each having the same vertical and horizontal propagation delay components—i.e., in this exemplary embodiment 5 Horizontal and 2 Vertical) that provides the programmed relationship of the tile clock signals (here, substantially no or zero skew) that are employed by each of the logic tiles; in this exemplary embodiment, Clock 1 signal input is received by Logic Tile 1 which, in addition to distributing and transmitting the clock signal to Logic Tile 2, incorporates a delay (which includes vertical and horizontal components of the propagation delay) that provides a predetermined relationship of the clock signal employed by Logic Tile 1 to the clock signals of Logic Tiles 2-5 (and, in certain embodiments, one, some or all of the other Logic Tiles of the programmable/configurable logic circuitry); notably, although not illustrated in FIG. 9, more than one clock signal input may be received by one or more clock tiles as described and illustrated herein; the one or more of the clock signal inputs may originate directly or indirectly from clock circuitry disposed "on-chip", for example, clock circuitry integrated in/on the die of the integrated circuit (see, for example, FIG. 1A) or clock circuitry which is partially or entirely external to the die of the integrated circuit (for example, Clock Signal Input may originate on another logic tiles and/or clock alignment circuitry (for example, a DLL or PLL) which is partially or fully on-chip or off-chip.

With reference to FIG. 9, the exemplary clock distribution and distribution path, and direction thereof, is indicated by the bold line and the arrows wherein the clock distribution and transmission circuitry of each logic tile is configured or programmed to provide a clock distribution and distribution path (each having the same vertical and horizontal propagation delay components—i.e., in this exemplary embodiment 5 Horizontal and 2 Vertical) that provides an exemplary programmed relationship of the tile clock signals (here, substantially no or zero skew) that are employed by each of the logic tiles. In this exemplary embodiment, the clock signal input is received by Logic Tile 1 which, in addition to distributing and transmitting the clock signal to Logic Tile 2, incorporates a delay (which includes vertical and horizontal components of the propagation delay) that provides a predetermined relationship of the clock signal employed by Logic Tile 1 to the clock signals of Logic Tiles 2-5 (and, in certain embodiments, one, some or all of the other Logic Tiles of the programmable/configurable logic circuitry). In this exemplary embodiment, each of the Logic Tiles have incorporated the same clock delay (5 Horizontal and 2 Vertical) using, in certain instances, u-turn circuitry, to balance the clock skew between the Logic Tiles.

Thus, although many of the embodiments are described in the context of a square shape tile (where the vertical and horizontal components of the propagation delay are equal or substantially equal), the present inventions may be implemented where the lengths of the vertical and horizontal clock signal lines are not equal. Under these circumstances, the relationship of the clock signal line delay to vertical and horizontal delay may be separately determined and/or calculated by control circuitry and thereafter appropriately configured to provide a predetermined clock skew (which in FIG. 9 is zero). All of the inventions described and illustrated herein are entirely applicable to non-square logic tile shapes or to logic tiles where the vertical component of the propagation delay is different from the horizontal component of the propagation delay. For the sake of brevity, the discussions of the inventions set forth herein in connection with non-square shaped tiles (or logic tiles having an amount of propagation delay in a first direction on the logic tile that differs from an amount of propagation delay in a second direction on the logic tile) will not be repeated. As such, a separate discussion for each and every logic tile shape is not provided; however the applicability will be clear to one of ordinary skill in the art based on the instant disclosure to, for example, square, rectangle, trapezoid, pentagon and/or hexagon and/or logic tiles having components of the propagation delay within the that differ, for example, based on the direction of the clock path).

Notably, the present inventions are applicable to clocking circuitry and architectures beyond the x-y dimension or plane. For example, in the context of a 3-D integrated circuit chips where tiles may exist on different silicon layers or where the clock architecture traverses vertically within an integrated circuit, the clock paths would be matched in the z dimension or plane. To be sure, the applicability of the inventions described and/or illustrated herein to beyond the x-y dimension or plane will be clear to one of ordinary skill in the art in view of this application.

The term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The memory which stores the data, equations, relationships, and/or look up table may be a permanent, semi-permanent or temporary (i.e., until re-programmed) storage that is discrete or resident on (i.e., integrated in), for example, the control circuitry. In connection with this invention, the memory may store the programmable skew relationship (whether zero or non-zero) between the Tile Clock Signals and Tile Clocks of the Logic Tiles of the Programmable/Configurable Logic Circuitry. As such, in one embodiment, the memory may be one time programmable, or data, equations, relationships, and/or look up table employed by the control circuitry may be one time programmable (for example, programmed during test or at manufacture). In another embodiment, the memory is more than one time programmable and, as such, the predetermined values and/or band limits employed by the control circuitry may be modified after test and/or manufacture.

Notably, the u-turn circuits have been described as consisting of buffers. However, the u-turn circuits may be comprised of any active or passive element now known or later developed which may be employed to generate a desired or programmable skew and/or phase relative to the tile clock signals of other logic tiles of the programmable/configurable logic circuitry of an integrated circuit. For example, in one embodiment, one or more conventional-type buffers may be employed.

As mentioned above, the techniques described herein may be implemented using one or more processors (suitably programmed) to perform, execute and/or assess one or more of the functions or operations described herein to generate clock signal distribution and transmission networks or architectures of the present inventions.

Moreover, the present inventions may be employed in conjunction with any of the inventions described and illustrated in PCT Application Serial Nos. PCT/US2014/029404 and PCT/US2014/029407. For the sake of brevity, such combinations will not be discussed, in detail, separately herein.

Notably, various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as preferred or advantageous, for example, over other embodiments or implementations; rather, it is intended convey or indicate the embodiment or embodiments are example embodiment(s).

Finally, although the present inventions have been described in certain specific aspects, many additional modifications and variations would be apparent to those skilled in the art. It is therefore to be understood that the present inventions may be practiced otherwise than specifically described without departing from the scope and spirit of the present invention. Thus, embodiments of the present inventions should be considered in all respects as illustrative and not restrictive.

In the claims, and elsewhere, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)). Further, the term "logic tile" means a design unit or block of a plurality of transistors (typically thousands to millions), which, in this application, is capable of connecting or connected to a plurality of neighboring "tile", "core" or "block" (for example, in or during operation).

As used in the claims, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus.

What is claimed is:

1. An integrated circuit comprising:
a plurality of logic tiles, wherein each logic tile includes a plurality of edges and, during operation, is configurable to connect with at least one logic tile adjacent to each edge of the logic tile, and wherein each logic tile includes:
 a plurality of input/output clock paths, wherein each input/output clock path is associated with a different edge of the logic tile, the plurality of input/output clock paths include:
  a plurality of input clock paths, each input clock path configurable to receive a tile input clock signal from a connected adjacent first logic tile, and
  a plurality of output clock paths, each output clock path configurable to output a tile output clock signal to a connected adjacent second logic tile, wherein at least one of the output clock path includes:
   a u-turn circuit, connected to or in an associated output clock path, to (i) receive a tile clock signal having a first predetermined skew relative to the tile output clock signal and (ii) provide a tile clock signal with a second predetermined skew;
 clock generation circuitry, coupled to the u-turn circuit of the output clock path, to receive the tile clock signal from the u-turn circuit and generate a tile clock based thereon; and
 programmable logic circuitry, coupled to the clock generation circuitry, to receive the tile clock and perform operations based thereon.

2. The integrated circuit of claim 1 wherein the u-turn clock circuit of each logic tile includes one or more buffers.

3. The integrated circuit of claim 1 wherein the u-turn clock circuit of each logic tile consists essential of one or more buffers.

4. The integrated circuit of claim 1 wherein each logic tile includes four or more input/output clock paths, each input/output clock path is associated with a different edge of the logic tile.

5. The integrated circuit of claim 1 wherein the tile clock includes a programmable skew that is associated with the logic tile.

6. The integrated circuit of claim 1 wherein the logic tile includes a plurality of u-turn circuits, at least one connected to or in each output clock path clock.

7. An integrated circuit comprising:
a plurality of logic tiles, wherein each logic tile includes a plurality of edges and, during operation, is configurable to connect with one or more adjacent logic tiles at an associated edge of the logic tile, and wherein:
a first logic tile includes:
 a plurality of input/output clock paths, wherein each input/output clock path is associated with a different edge of the first logic tile, the plurality of input/output clock paths include:
  a plurality of input clock paths, including a first input clock path configurable to receive a tile input clock signal from a second logic tile adjacent at a first side of the first logic tile, and
  a plurality of output clock paths, including (a) a first output clock path configurable to output a first tile output clock signal to an adjacent third logic tile wherein the third logic tile is connected at a second side of the first logic tile, and (b) a second output clock path configurable to output a second tile output clock signal to an adjacent fourth logic tile wherein the fourth logic tile is connected at a third side of first logic tile, and wherein at least one of the plurality of output clock paths includes a u-turn circuit, connected to or in the at least one output clock path, to (i) receive a signal having a predetermined skew relative to the first tile output clock signal and (ii) provide a first tile clock signal;
 clock generation circuitry, coupled to the u-turn circuit, to receive the first tile clock signal from the u-turn circuit and generate a first tile clock based thereon; and
 programmable logic circuitry, coupled to the clock generation circuitry, to receive the first tile clock and perform operations based thereon.

8. The integrated circuit of claim 7 wherein the first tile clock and the first tile output clock signal have a predetermined skew therebetween.

9. The integrated circuit of claim 7 wherein the first tile clock and the first tile output clock signal have a substantially zero skew therebetween.

10. The integrated circuit of claim 7 wherein the first and second u-turn clock circuits are one or more buffers.

11. The integrated circuit of claim 7 wherein the logic tile includes a plurality of u-turn circuits, at least one connected to or in each output clock path clock.

12. The integrated circuit of claim 7 wherein:
the third logic tile includes:
 a plurality of input/output clock paths, wherein each input/output clock path of the third logic tile is associated with a different edge of the third logic tile, the plurality of input/output clock paths of the third logic tile include:
  a plurality of input clock paths, including a first input clock path configurable to receive the first tile output clock signal from the first logic tile, wherein the third logic tile is connected to the first logic tile at a first side of the third logic tile, and
  a plurality of output clock paths, including (a) a first output clock path configurable to output a third tile output clock signal to a fifth logic tile which is connected at a second side of third logic tile, and (b) a second output clock path configurable to output a fourth tile output clock signal to a sixth logic tile which is connected at a third side of the third logic tile, wherein at least one of the plurality of output clock paths includes a u-turn circuit, connected to or in the at least one output clock path of the third logic tile, to (i) receive a signal having a predetermined skew relative to the third tile output clock signal and (ii) provide a third tile clock signal;
 clock generation circuitry, coupled to the u-turn circuit of the third logic tile, to receive the third tile clock signal from the u-turn circuit of the third logic tile and generate a third tile clock based thereon; and
 programmable logic circuitry, coupled to the clock generation circuitry of the third logic tile, to receive the third tile clock and perform operations based thereon.

13. The integrated circuit of claim 12 wherein the first tile clock and the third tile clock have a predetermined skew therebetween.

14. The integrated circuit of claim 12 wherein the first tile clock and the third tile clock have a substantially zero skew therebetween.

15. An integrated circuit comprising:
a plurality of logic tiles, including:
- a first logic tile which, during operation, is configurable to connect with one or more adjacent logic tiles, and wherein first logic tile includes:
  - a plurality of input/output clock paths, wherein each input/output clock path includes:
    - a first input clock path to receive a first tile input clock signal from a first adjacent logic tile connected thereto,
    - a second input clock path to receive a second tile input clock signal from the first adjacent logic tile connected thereto,
    - a plurality of output clock paths including:
      - a first output clock path configurable to output a first tile output clock signal to a second adjacent logic tile connected thereto,
      - a second output clock path configurable to output a second tile output clock signal to the second adjacent logic tile connected thereto,
      - a first u-turn circuit, connected to or in at least one output clock path, to (i) receive a signal having a predetermined skew relative to the first tile output clock signal and (ii) provide a first signal;
      - a second u-turn circuit, connected to or in at least one output clock path, to (i) receive a signal having a predetermined skew relative to the second tile output clock signal and (ii) provide a second signal;
  - clock generation circuitry, coupled to the first and second u-turn circuits, to receive the first and second signals from the first and second u-turn circuits, respectively, and generate first and second tile clocks using the first and second signals, respectively; and
- programmable logic circuitry, coupled to the clock generation circuitry, to receive the first and second tile clocks and perform operations based thereon.

16. The integrated circuit of claim 15 wherein the first tile clock and the first tile output clock signal have a predetermined skew therebetween.

17. The integrated circuit of claim 15 wherein the first tile clock and the first tile output clock signal have a substantially zero skew therebetween.

18. The integrated circuit of claim 15 wherein the first and second u-turn clock circuits are one or more buffers.

19. The integrated circuit of claim 15 wherein the first and second u-turn clock circuits consist essentially of one or more buffers.

20. The integrated circuit of claim 15 wherein the logic tile includes a plurality of u-turn circuits, at least one u-turn circuit connected to or in each output clock path clock.

\* \* \* \* \*